United States Patent
Wu et al.

(10) Patent No.: US 7,626,429 B2
(45) Date of Patent: Dec. 1, 2009

(54) DRIVING CIRCUIT TO DRIVE AN OUTPUT STAGE

(75) Inventors: Kuo-Hung Wu, Sinshih Township, Tainan County (TW); Kuan-Jen Tseng, Sinshih Township, Tainan County (TW)

(73) Assignee: Himax Analogic, Inc. (TW)

( * ) Notice: Subject to any disclaimer, the term of this patent is extended or adjusted under 35 U.S.C. 154(b) by 0 days.

(21) Appl. No.: 12/060,483

(22) Filed: Apr. 1, 2008

(65) Prior Publication Data

US 2009/0243666 A1    Oct. 1, 2009

(51) Int. Cl.
*H03B 1/00*    (2006.01)
(52) U.S. Cl. .................. 327/112; 327/108; 327/333
(58) Field of Classification Search ......... 327/389–391, 327/379, 382, 333, 170, 108–112; 326/68, 326/81, 88, 80, 22–27; 365/230.06
See application file for complete search history.

(56) References Cited

U.S. PATENT DOCUMENTS

| | | | | |
|---|---|---|---|---|
| 4,831,284 A | * | 5/1989 | Anderson et al. | 326/116 |
| 4,989,127 A | * | 1/1991 | Wegener | 363/16 |
| 6,348,767 B1 | * | 2/2002 | Chen et al. | 315/224 |
| 7,235,931 B2 | * | 6/2007 | Matsushima et al. | 315/240 |
| 7,268,596 B2 | * | 9/2007 | Ota et al. | 327/112 |

* cited by examiner

*Primary Examiner*—Long Nguyen
*Assistant Examiner*—Sibin Chen
(74) *Attorney, Agent, or Firm*—Hayes Soloway P.C.

(57) ABSTRACT

A driving circuit to drive an output stage comprising a high side NMOS and a low side NMOS is provided. The driving circuit comprises: a diode comprising an anode and a cathode, wherein the anode is electrically connected to a first voltage source and the sources of a first and a second PMOS; a third and a fourth PMOS both comprising a drain, a source and a gate, wherein the sources are respectively connected to the gates of the second and first PMOS, the drains are respectively connected to the drains of the first and second PMOS. A first and a second NMOS both comprise a drain, a source and a gate, wherein the drains are respectively connected to the drain of the fourth and third PMOS, the sources are coupled to a second voltage source, the gates are respectively connected to a first input and a second input.

8 Claims, 3 Drawing Sheets

DRIVING CIRCUIT TO DRIVE AN OUTPUT STAGE

BACKGROUND

1. Field of Invention

The present invention relates to a driving circuit. More particularly, the present invention relates to a driving circuit to drive an output stage comprising a high side NMOS and a low side NMOS.

2. Description of Related Art

An output stage with high efficiency and small area is an important issue of a power amplifier circuit. The conventional design of the output stage comprises a PMOS and an NMOS. However, in the latest technology, the output stage comprises two NMOS as depicted in FIG. 1. The two NMOS output stage 1 comprises a high-side NMOS 10 and a low-side NMOS 12. The high-side NMOS comprises a drain, a gate and a source, wherein the drain is connected to a first voltage (PVDD), the gate is connected to a high-side driver 11 and the source is connected to an output terminal (OUT). The low-side NMOS 12 comprises a drain, a gate and a source, wherein the drain is connected to a second voltage (PVSS), the gate is connected to a low-side driver 13 and the source is connected to the output terminal (OUT). Although such a design provides smaller area and greater efficiency, it brings new problems as well. One of the problems is that the maximum value of Vgs and Vds of the NMOS are not symmetric, wherein the Vgs can't be a high value. Therefore, if the high side driver 11 of the high side NMOS 10 of the output stage 1 has an inappropriate design, the high side NMOS 10 would be broken since the output voltage of the source side should be much higher than the input voltage of the gate side to provide an amplification function.

Accordingly, what is needed is a driving circuit to drive an output stage and provide a mechanism to protect the high side NMOS to overcome the above issues. The present invention addresses such a need.

SUMMARY

A driving circuit to drive an output stage comprising a high side NMOS and a low side NMOS is provided. The driving circuit comprises: a diode comprising an anode and a cathode, wherein the anode is electrically connected to a first voltage source and the sources of a first and a second PMOS; a third and a fourth PMOS both comprising a drain, a source and a gate, wherein the sources are respectively connected to the gates of the second and first PMOS, the drains are respectively connected to the drains of the first and second PMOS. A first and a second NMOS both comprise a drain, a source and a gate, wherein the drains are respectively connected to the drain of the fourth and third PMOS, the sources are coupled to a second voltage source, the gates are respectively connected to a first input and a second input.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
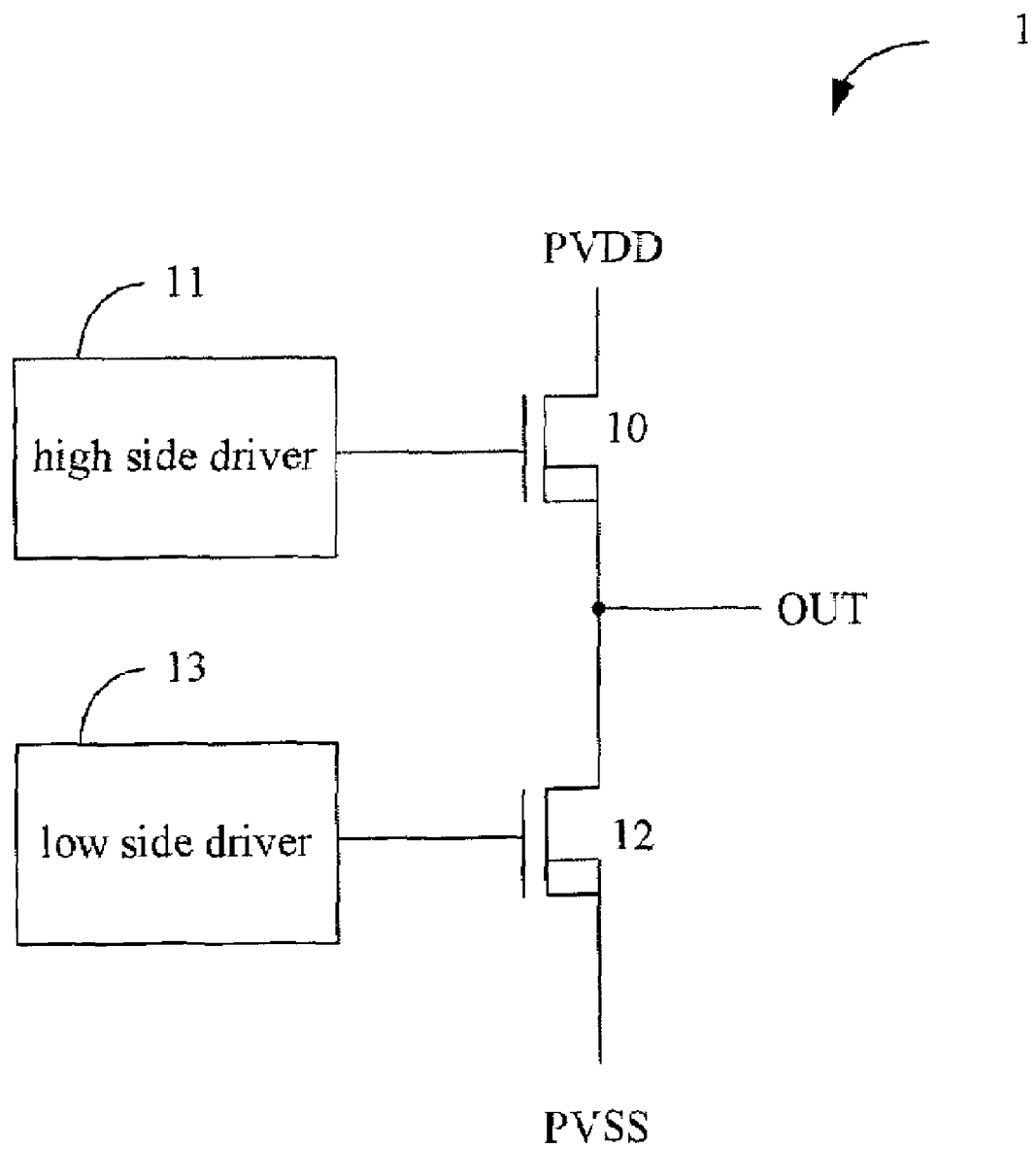
FIG. 1 is an output stage with two NMOS in the prior art.

Reference will now be made in detail to the present embodiments of the invention, examples of which are illustrated in the accompanying drawings. Wherever possible, the same reference numbers are used in the drawings and the description to refer to the same or like parts.

Figure 2:
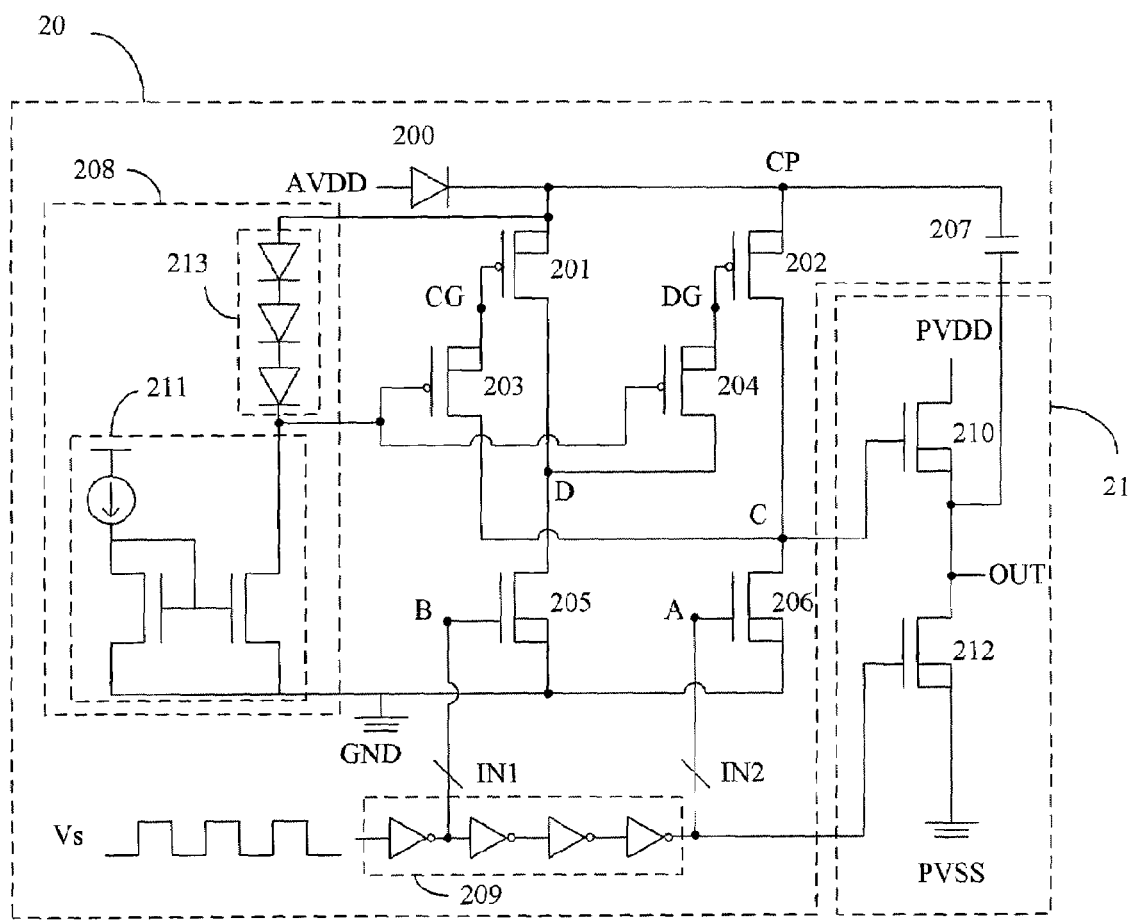
FIG. 2 is a diagram of a driving circuit and an output stage of the first embodiment of the present invention.

Please refer to FIG. 2, a diagram of a driving circuit 20 and an output stage 21 of the first embodiment of the present invention, wherein the driving circuit 20 is to drive the output stage 21 which is the same output stage as depicted in FIG. 1, wherein the drain of the high side NMOS 210 is electrically connected to the source of the low side NMOS 212 and a output terminal (OUT). The driving circuit 20 comprises: a diode 200, a first PMOS 201, a second PMOS 202, a third PMOS 203, a fourth PMOS 204, a first NMOS 205 and a second NMOS 206, a capacitor 207, and a voltage-limiting circuit 208. The diode 200 comprises an anode and a cathode, wherein the anode is electrically connected to a first voltage source (AVDD). The sources of the first and second PMOS 201 and 202 are connected to the anode of the diode 200.

The third PMOS 203 comprises a drain, a source and a gate, wherein the source is electrically connected to the gate of the second PMOS 202, the drain is electrically connected to the drain of the first PMOS 201 and the gate of the high side NMOS 210. The fourth PMOS 204 comprises a drain, a source and a gate, wherein the source is electrically connected to the gate of the first PMOS 201 and the drain is electrically connected to the drain of the second PMOS 202. The first NMOS 205 comprises a drain, a source and a gate, wherein the drain is electrically connected to the drain of the fourth PMOS 204, the source is coupled to a second voltage source (GND), the gate is electrically connected to a first input (IN1). The second NMOS 206 comprises a drain, a source and a gate, wherein the drain is electrically connected to the drain of the third PMOS 203, the source is coupled to the second voltage source (GND) and the gate is connected to a second input (IN2). The first input IN1 and the second input IN2 are substantially provided by a voltage source Vs through four inverters 209. The voltage source Vs passes through one inverter and becomes the first input IN1. The voltage source 204 keeps passing other three inverters and becomes the second input IN2. Thus, the first and second input 202 and 203 are inverted to each other.

The capacitor 207 electrically connected to the output terminal (OUT) and the anode of the diode 200. The voltage-limiting circuit 208 comprises a current mirror 211 and a load 213, wherein a first end of the load 213 is connected to the anode of the diode 200 and a second end of the load 213 is connected to the current mirror 211 and the gates of the third and fourth PMOS 203 and 204. In the present embodiment, the load 213 comprises 3 diodes to limit the voltage across the load 213. In other embodiment, a plurality of resistors can be used to perform the same function.

Figure 3:
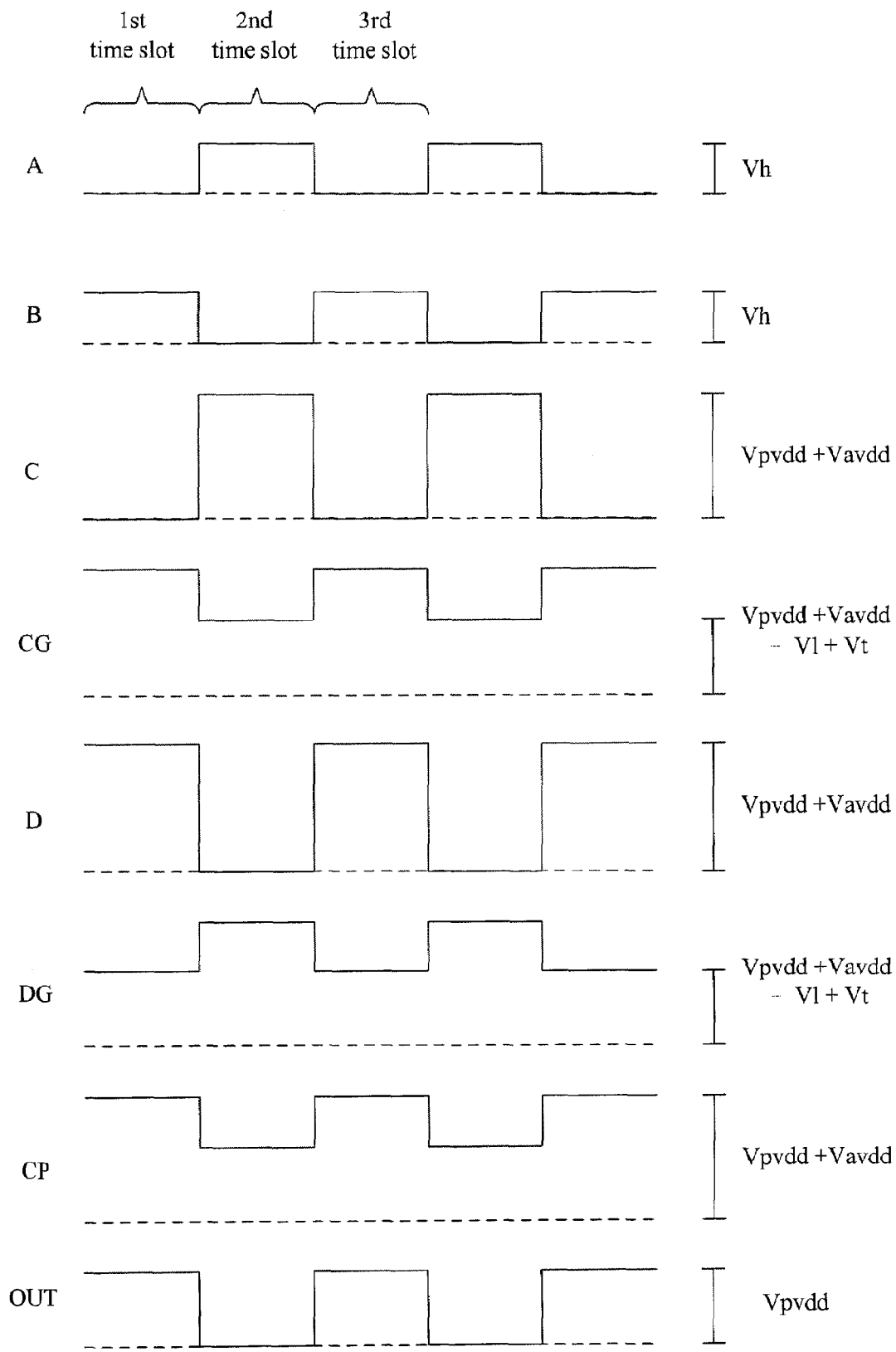
FIG. 3 is a timing diagram of the voltage value of various points in the driving circuit of the present invention.

In order to make a clear description of the operation of the driving circuit, suppose that the gate of the second NMOS 206 is point A, the gate of the first NMOS 205 is point B, the drain of the second NMOS 206 is point C, the drain of the first NMOS 205 is point D, the gate of the second PMOS 202 is point DG, the gate of the first PMOS 201 is point CG, and the cathode of the diode 200 is point CP. Please refer to FIG. 3 at the same time, a voltage waveform diagram of the point Vs, A, B, C, CG, D DG, CP, and OUT.

In the first time slot, the INT1 and INT2, i.e. A and B are in low state (0v) and high state (Vh) respectively. The first NMOS 205 is on, the second NMOS 206 is off, the first PMOS 201 is off, the second PMOS 202 is on, the third PMOS 203 is on, fourth PMOS 204 is off, the high side NMOS 210 is on and the low side NMOS 212 is off. The voltage of A and B are substantially supplied by Vs, thus, when Vs switches to a reverse phase, the A and B switch as well. The voltage of A turns to Vh, makes the second NMOS 206 turn on and the low side NMOS 212 turns on as well. Therefore, the voltage of the point OUT keeps dropping until 0. The voltage of B becomes 0v and makes the first NMOS 205 turn off. Due to the turn-on of the second NMOS 206, C and CG discharges through the second NMOS 206. The voltage of CG starts to drop until the first PMOS 201 turns on and the third PMOS 203 turns off. If the voltage drop between the two ends of the load 213 is V1, the voltage of CP in the first time slot is Vcp1, and the threshold voltage of each PMOS or NMOS is Vt, the voltage value to turn the third PMOS off is approximately Vcp1−V1+Vt. However, the voltage of C keeps dropping until 0 and makes the high side NMOS 210 turn off. Therefore, the PVDD is isolated from OUT. The point CP won't discharge from OUT because of the capacitor 207. The turn-on of the first PMOS 201 starts to pull down the voltage of CP, but the first NMOS 205 is now turned off and can't act as a discharge path to pull down the voltage of CP, thus the voltage of DG starts to rise to make the second PMOS turns off and the fourth PMOS turns on. The voltage of DG will finally reach the value of Vcp1. It's noticed that due to the existence of the diode 200 and the first voltage source AVDD, the lowest voltage value of CP won't drop below the value of AVDD, i.e. Vavdd. As a result, in the second time slot, the A and B are in high state (Vh) and low state (Vh) respectively. The first NMOS 205 is off, the second NMOS 206 is on, the first PMOS 201 is on, the second PMOS 202 is off, the third PMOS 203 is off, fourth PMOS 204 is on, the high side NMOS 210 is off and the low side NMOS 212 is on.

When Vs switches again in the third time slot, the A and B switch again as well. The voltage of B turns to Vh, makes the first NMOS 205 turn on. The voltage of A turns to 0, makes the second NMOS 206 turn off and the low side NMOS 212 turns off as well. Due to the turn-on of the first NMOS 205, D and DG discharges through the first NMOS 205. The voltage of DG starts to drop until the second PMOS 202 turns on and the fourth PMOS 204 turns off. As in the previous description, the voltage value to turn the third PMOS off is approximately Vcp1−V1+Vt. However, the voltage of D keeps dropping until 0. The turn-on of the second PMOS 202, the voltage of CP starts to charge the point C and makes the high side NMOS 210 turn on. If the voltage of the point PVDD is Vpvdd, the point PVDD keep charging the point OUT until Vpvdd and further rise the voltage of CP until Vpvdd+Vavdd. Finally, the voltage of the point C reaches Vpvdd+Vavdd as well. Furthermore, the point CG rises to Vpvdd+Vavdd through the point C too. Thus, the voltage of CG makes the first NMOS 201 turn off and make the third NMOS 203 turn on. As a result, the third time slot is the same as the first time slot.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A driving circuit for driving an output stage comprising a high side NMOS and a low side NMOS, wherein the driving circuit comprises:
   a diode comprising an anode and a cathode, wherein the anode is electrically connected to a first voltage source;
   a first PMOS and a second PMOS, the sources of which are connected to the cathode anode of the diode;
   a third PMOS comprising a drain, a source and a gate, wherein the source is electrically connected to the gate of the second PMOS, the drain is electrically connected to the drain of the first PMOS and the gate of the high side NMOS;
   a fourth PMOS comprising a drain, a source and a gate, wherein the source is electrically connected to the gate of the first PMOS and the drain is electrically connected to the drain of the second PMOS;
   a first NMOS comprising a drain, a source and a gate, wherein the drain is electrically connected to the drain of the fourth PMOS, the source is coupled to a second voltage source, the gate is electrically connected to a first input; and
   a second NMOS, comprising a drain, a source and a gate, wherein the drain is electrically connected to the drain of the third PMOS, the source is coupled to the second voltage source and the gate is connected to a second input.

2. The driving circuit of claim 1, wherein the source of the high side NMOS is electrically connected to the drain of the low side NMOS and an output terminal.

3. The driving circuit of claim 2, further comprising a capacitor electrically connected to the output terminal and the cathode of the diode.

4. The driving circuit of claim 1, further comprising a voltage-limiting circuit, the voltage-limiting circuit comprises a current mirror and a load, wherein a first end of the load is connected to the cathode, a second end of the load is connected to the current minor and the gates of the third and fourth PMOS.

5. The driving circuit of claim 4, the load is at least one diode.

6. The driving circuit of claim 1, wherein the voltage waveforms of the first input and the second input are inverted to each other.

7. The driving circuit of claim 1, the gate of the low side NMOS is electrically connected to the second input.

8. The driving circuit of claim 1, wherein the second voltage is ground.

* * * * *